(12) United States Patent
Zhou

(10) Patent No.: US 10,403,549 B2
(45) Date of Patent: Sep. 3, 2019

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/993,974

(22) Filed: May 31, 2018

(65) Prior Publication Data

US 2018/0350694 A1 Dec. 6, 2018

(30) Foreign Application Priority Data

Jun. 1, 2017 (CN) .......................... 2017 1 0403508

(51) Int. Cl.
| | |
|---|---|
| *H01L 21/84* | (2006.01) |
| *H01L 27/12* | (2006.01) |
| *H01L 29/06* | (2006.01) |
| *H01L 29/66* | (2006.01) |
| *H01L 29/78* | (2006.01) |

(Continued)

(52) U.S. Cl.
CPC ................ *H01L 21/823481* (2013.01); *H01L 21/31055* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/1211* (2013.01); *H01L 29/0649* (2013.01); *H01L 29/41791* (2013.01);

(Continued)

(58) Field of Classification Search
CPC ............. H01L 29/66795; H01L 29/785; H01L 21/823431; H01L 27/0886; H01L 21/823821; H01L 27/0924; H01L 21/845; H01L 27/1211; H01L 29/41791
See application file for complete search history.

(56) References Cited

U.S. PATENT DOCUMENTS 9,502,569 B2* 11/2016 Zhao ................... H01L 29/7853
9,805,982 B1* 10/2017 Zang ............... H01L 21/823456
(Continued)

*Primary Examiner* — Ngan V Ngo
(74) *Attorney, Agent, or Firm* — Anova Law Group, PLLC

(57) ABSTRACT

A method for fabricating a semiconductor structure includes forming a plurality of initial fin structures on a substrate, each including a first region used as a first fin structure, a second region on the first region, and a third region on the second region; forming a first isolation layer on the substrate; removing each third region to form a first opening in the first isolation layer; forming a second isolation layer on sidewall surfaces of each first opening; and removing each second region to form an initial second opening; performing an etching process on the first isolation layer on sidewall surfaces of each initial second opening to form a second opening; forming a second fin structure in each first opening and the second opening; and removing a portion of the first isolation layer and the second isolation layer to expose a portion of sidewall surfaces of each second fin structure.

14 Claims, 7 Drawing Sheets

(51) Int. Cl.
  *H01L 27/088* (2006.01)
  *H01L 27/092* (2006.01)
  *H01L 29/417* (2006.01)
  *H01L 21/3105* (2006.01)
  *H01L 21/8234* (2006.01)
  *H01L 21/8238* (2006.01)

(52) U.S. Cl.
  CPC ...... *H01L 29/66795* (2013.01); *H01L 29/785* (2013.01)

(56) References Cited

U.S. PATENT DOCUMENTS

| | | | |
|---|---|---|---|
| 9,812,567 B1* | 11/2017 | Basker | H01L 29/7827 |
| 2014/0061820 A1* | 3/2014 | Reznicek | H01L 21/823821 |
| | | | 257/401 |
| 2015/0340469 A1* | 11/2015 | Chen | H01L 21/3086 |
| | | | 438/283 |
| 2018/0006023 A1* | 1/2018 | Nowak | H01L 21/76895 |
| 2018/0082953 A1* | 3/2018 | Bi | H01L 23/5283 |
| 2018/0097001 A1* | 4/2018 | Bi | H01L 27/0886 |
| 2018/0151716 A1* | 5/2018 | Fung | H01L 29/6653 |
| 2018/0158957 A1* | 6/2018 | Rachmady | H01L 29/66795 |
| 2018/0342428 A1* | 11/2018 | Leobandung | H01L 21/845 |

* cited by examiner

SEMICONDUCTOR DEVICES AND FABRICATION METHODS THEREOF

CROSS-REFERENCES TO RELATED APPLICATIONS

This application claims the priority of Chinese Patent Application No. CN201710403508.X, filed on Jun. 1, 2017, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

With the rapid development of semiconductor technology, semiconductor devices have been developed towards having a higher device density and a higher integration level, and the dimension of the gate structures in planar transistors has become shorter and shorter. As the dimension of the gate structures is reduced, the ability of conventional planar transistors in controlling channel current is degraded, which causes the short-channel effects (SCEs) and leads to leakage currents. As a result, the electrical performance of the semiconductor devices may be affected.

In order to overcome the SCE of transistors and suppress the leakage currents, fin field-effect transistors (Fin-FETs) are widely used. The Fin-FET is a multi-gate device, and the structure of the Fin-FET includes a fin structure and a dielectric layer formed on the surface of the semiconductor substrate. The dielectric layer covers a portion of the sidewall surface of the fin structure, and the top surface of the dielectric layer is lower than the top surface of the fin structure. The structure of the Fin-FET also includes a gate structure formed on the dielectric layer and also covers the top and the sidewall surfaces of the fin structure. The structure of the Fin-FET further includes a source region and a drain region formed in the fin structure on the two sides of the gate structure, respectively.

In a conventional planar transistor, a large amount of heat generated in the channel region is dispersed laterally, and thus the heat dispersed into the substrate may be limited. However, in a Fin-FET, due to lateral thermal insulation, more heat may be dispersed into the substrate, which causes the local temperature to be overly high, and thus affects the stability of the device. In the meantime, because emission of hot electrons occurs in the drain region, the self-heating effect occurring in the drain region of the Fin-FET may be more severe than the self-heating effect occurring in the source region. The heat generated in the drain region may be dispersed into the substrate as well as other portion of the fin structures, resulting in an increase in the local temperature of the transistor. In particular, as the density of semiconductor devices increases and the dimension of semiconductor devices decreases, the self-heating effect becomes more serious. Therefore, the electrical performance of the formed Fin-FET may be degraded, and the reliability may be reduced.

The disclosed semiconductor devices and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes forming a plurality of initial fin structures on a substrate, each initial fin structure including a first region, a second region on the first region, and a third region on the second region; forming a first isolation layer on the substrate, the first isolation layer exposing top surfaces of the plurality of initial fin structures; removing each third region to form a first opening in the first isolation layer; forming a second isolation layer on sidewall surfaces of each first opening; and removing the second region under each first opening to form an initial second opening connecting the first opening. The first region under the initial second opening is used as a first fin structure. The method also includes performing an etching process on the first isolation layer on sidewall surfaces of each initial second opening to form a second opening exposing the first isolation layer; forming a second fin structure in each first opening and the second opening under the first opening; and removing a top portion of each of the first isolation layer and the second isolation layer to expose a portion of sidewall surfaces of each second fin structure.

Another aspect of the present disclosure provides a semiconductor device. The semiconductor structure includes a plurality of first fin structures formed on a substrate, each first fin structure having a first width along a first direction perpendicular to a length direction of the first fin structure; and a plurality of second fin structures, each formed on a first fin structure and including a first region located on the first fin structure and a second region located on the first region, the first region having a second width along the first direction, and the second region having a third width along the first direction. The second width is larger than the first width, and the first width is larger than the third width. The semiconductor structure also includes a first isolation layer, formed on the substrate and between adjacent first fin structures and adjacent second fin structures; and a second isolation layer formed on the first region and between a bottom portion of sidewall surfaces of each second region and the first isolation layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In semiconductor transistor device, the width of a second fin structure may be the same as the width of the fin structure. When the transistor device is powered up for operation, the self-heating effect may easily take place, and the electrical properties and the stability of the semiconductor device may be degraded.

FIGS. 1-4 illustrate schematic cross-section views of structures at certain stages of a method for fabricating a semiconductor structure.

Figure 1:
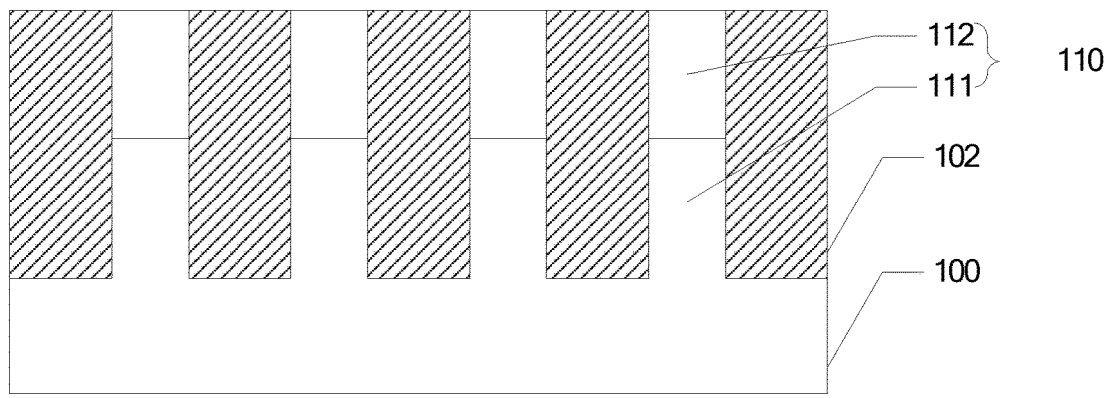
FIGS. 1-4 illustrate schematic cross-section views of structures at certain stages of a method for fabricating a semiconductor structure.

Referring to FIG. 1, a substrate 100 is provided. The substrate 100 includes a plurality of initial fin structures 110. Each initial fin structure 110 further includes a first region 111 and a second region 112 on the top of the first region 111. An isolation layer 102 is formed on the substrate 100. The isolation layer 102 covers the sidewall surfaces of the first region 111 and the second region 112 of each initial fin structure 110. The top surface of the second region 112 of each initial fin structure 110 is exposed by the isolation layer 102.

Figure 2:
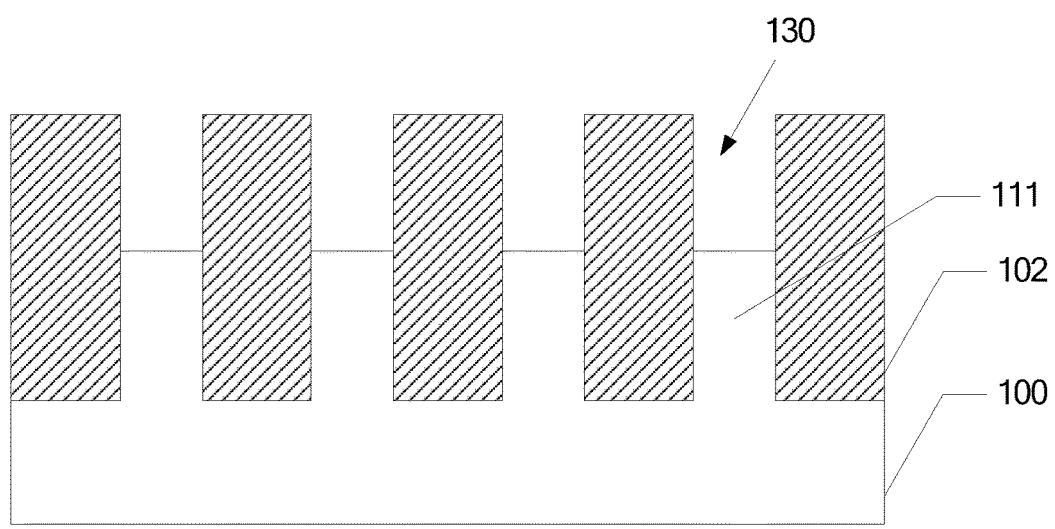

Referring to FIG. 2, the second region 112 (referring to FIG. 1) of each initial fin structure 110 (referring to FIG. 1) is removed to form an initial opening 130 in the isolation layer 102.

Figure 3:
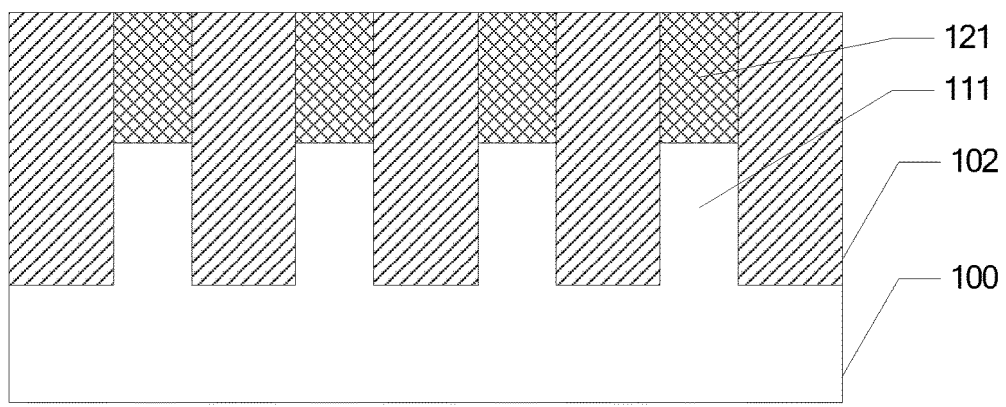

Referring to FIG. 3, a second fin structure 121 is formed in each initial opening 130 (referring to FIG. 2). Therefore, the second fin structure 121 is located on a corresponding first region 111.

Figure 4:
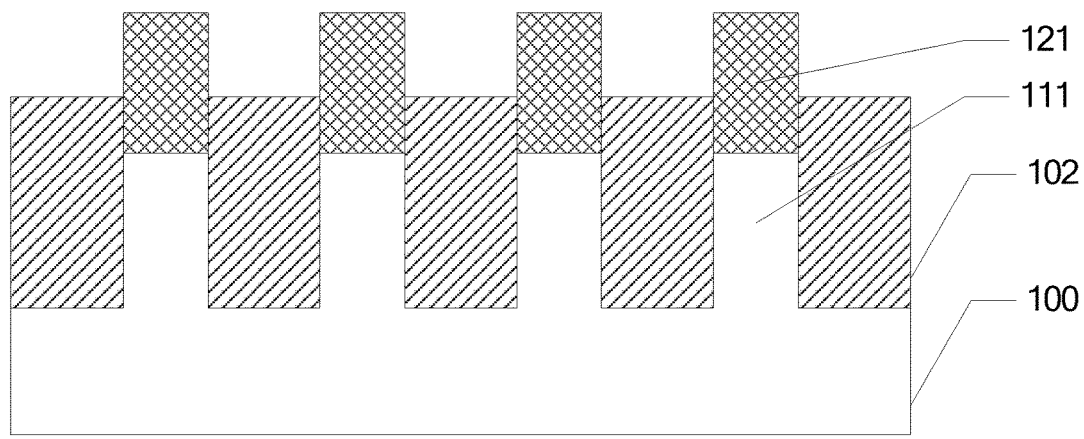

Referring to FIG. 4, the isolation layer 102 is etched to expose a portion of the sidewall surfaces of each second fin structure 121.

As the density of semiconductor devices increases, the second fin structure 121 may be a SiGe material layer and may serve as an upper channel material layer so that the transistor may have a relatively large current when the transistor is in an on state. The first region 111 may be a Si material layer and may serve as a lower channel material layer so that the transistor may have a relatively small current when the transistor is in an off state. As such, the electrical properties of the transistor may be improved. However, the thermal conductivity of the SiGe material layer (varies as the Ge doping concentration changes) is smaller than the thermal conductivity of Si material layer (150 W/mK), when the transistor is powered up to operate, the heat generated by the second fin structure 121 may not be released timely, leading to an increase in the channel temperature, such that the self-heating effect takes place. Therefore, as the dimension of the semiconductor devices becomes smaller and the density of the devices increases, the self-heating effect becomes severe, which may cause a loss in the device power and a decrease in the output capability of the device current, and may even result in functional failure.

Figure 11:
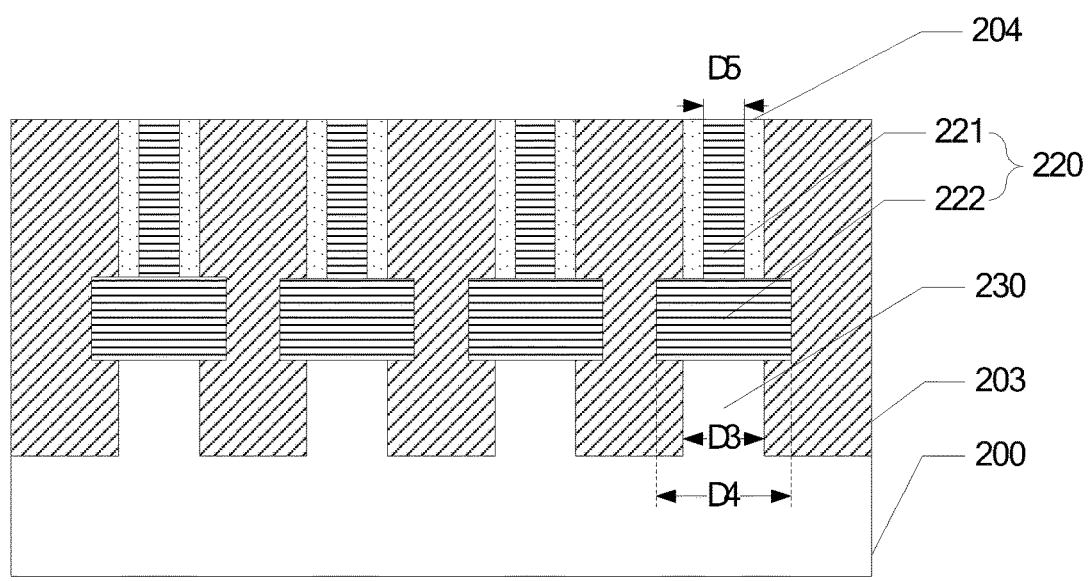
Figure 12:
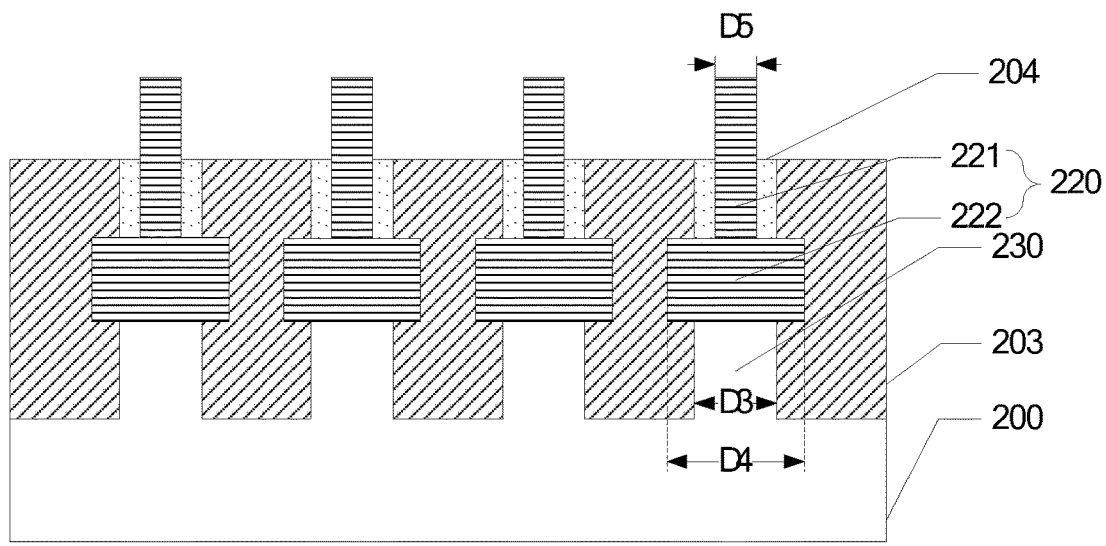
Figure 13:
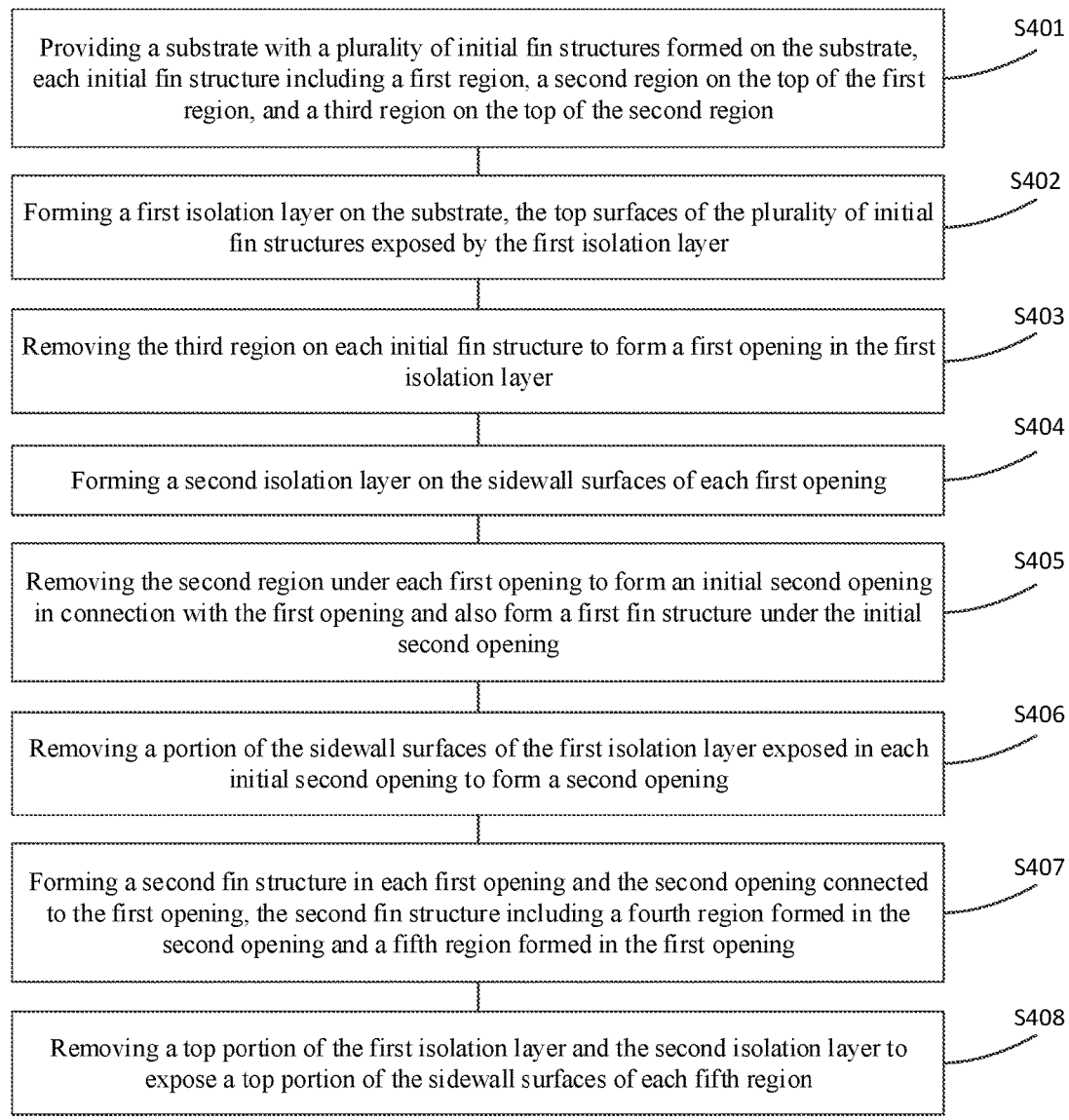
FIG. 13 illustrates a flowchart of the exemplary method for fabricating a semiconductor structure consistent with various embodiments of the present disclosure.

The present disclosure provides semiconductor structures and methods for fabricating the semiconductor structures. FIG. 13 illustrates a flowchart of the exemplary method for fabricating a semiconductor structure consistent with various embodiments of the present disclosure. FIGS. 5-12 illustrate schematic cross-section views of structures at certain stages of the exemplary fabrication method.

Figure 5:
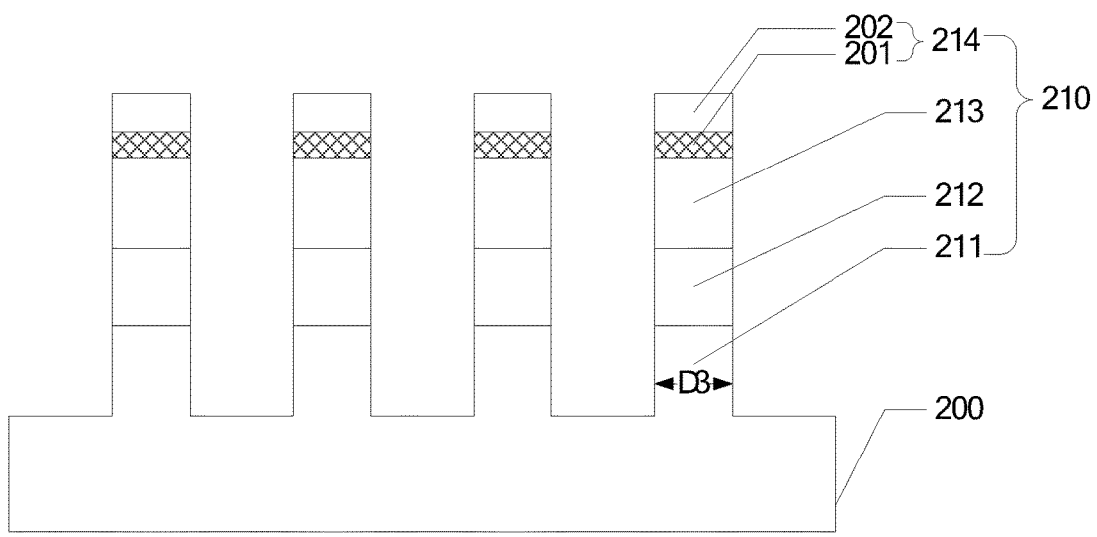
FIGS. 5-12 illustrate schematic cross-section views of structures at certain stages of an exemplary fabrication method for a semiconductor structure consistent with various embodiments of the present disclosure.

Referring to FIG. 13, at the beginning of the fabrication process, a substrate with a plurality of initial fin structures formed on the substrate may be provided, each initial fin structure including a first region, a second region on the top of the first region, and a third region on the top of the second region (S401). FIG. 5 illustrates a schematic cross-section view of a semiconductor structure consistent with some embodiments of the present disclosure.

Referring to FIG. 5, a substrate 200 may be provided. A plurality of initial fin structures 210 may be formed on the substrate 200. Each initial fin structure 210 may include a first region 211, a second region 212, and a third region 213. The second region 212 may be located on the top of the first region 211, and the third region 213 may be located on the top of the second region 212.

Each initial fin structure 210 may further include a mask structure 214. The mask structure 214 may be located on the top of the third region 213.

In one embodiment, the mask structure 214 may include a buffer layer 201 and a hard mask layer 202 formed on the buffer layer 201. In other embodiments, the mask structure may not include any buffer layer. For example, the mask layer may only include a hard mask layer.

In one embodiment, the plurality of initial fin structures 210 may be formed by a process including the following exemplary steps. A substrate 200 may be provided. Further, a buffer film may be formed on the surface of the substrate, and a hard mask film may be formed on the buffer layer. An initial patterned layer may then be formed on the hard mask film. The region covered by the initial patterned layer may correspond to the position and the shape of the subsequently-formed initial fin structures 210. The hard mask film, the buffer film, and the substrate 200 may be etched using the initial patterned layer as an etch mask. As such, the plurality of initial fin structures 210 may be formed. Each initial fin structure 210 may include a first region 211, a second region 212 located on the top of the first region 211, a third region 213 located on the top of the second region 212, and a mask structure 214 located on the top of the third region 213. The mask structure 214 may further include a buffer layer 201 formed from the buffer film and a hard mask layer 202 formed from the hard mask film.

The width of the first region 211 in a direction perpendicular to the length direction of the first region 211 may be a first width D3, as shown in FIG. 5. The first region 211, the second region 212, and the third region 213 may have an identical width in the direction perpendicular to the length direction of the first region 211. That is, in the direction perpendicular to the length direction of the first region 211, the width of the second region 212 and the width of the third region 213 may both equal to the width of the first region 211, i.e. the first width D3.

In one embodiment, the initial patterned layer may be a photoresist layer formed by a coating process followed by a photolithography process. In other embodiments, in order to reduce the feature size of the initial fin structures 210 and reduce the distance between neighboring initial fin structures 210, the photoresist layer may be formed by a multiple patterning mask process.

The substrate 200 may be made of single-crystalline silicon, polycrystalline silicon, amorphous silicon, germanium, SiGe, GaAs, or any other appropriate semiconductor material. Alternatively, the substrate 200 may be made of Si, Ge, SiGe, GaAs, or any other semiconductor material on insulator. In one embodiment, the substrate 200 is made of single-crystalline silicon.

In other embodiments, through an etching process, the first region, the second region, and the third region may be formed on a semiconductor layer fabricated on the surface of the substrate. The semiconductor layer may be formed on the surface of the substrate through a selective epitaxial deposition process. The substrate may be made of silicon, germanium, or SiGe. Alternatively, the substrate may be made of Si, Ge, SiGe, or any other appropriate semiconductor material on insulator, or made of glass, a Group III-V compound, or any other appropriate semiconductor material. The semiconductor layer may be made of silicon, germanium, SiC, or SiGe.

The mask structure 214 may serve as a polishing stop layer for a subsequently-formed first isolation film. For example, the difference in the polishing rate between the mask structure 214 and the first isolation film may be used to determine the end point of the polishing process. Once a relatively large change in the polishing rate is detected, the polishing process is determined as reaching the mask structure 214. As a result, the polishing process may be stopped, and thus over-polishing may be avoided.

The mask structure 214 may have a single-layer structure or a multiple-layer structure. The mask structure 214 may be made of one or more of $SiN_x$, SiON, amorphous silicon, BN, $TiN_x$, and any other material that can be used as a polishing stop layer.

Figure 6:
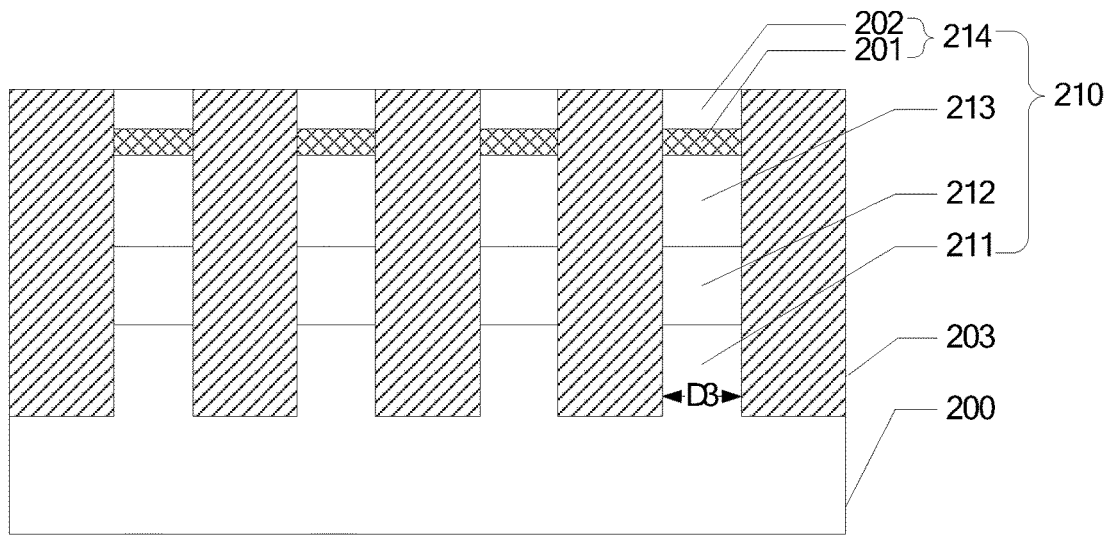

Further, returning to FIG. 13, a first isolation layer may be formed on the substrate, the first isolation layer exposing the top surfaces of the plurality of initial fin structures (S402). FIG. 6 illustrates a schematic cross-section view of a semiconductor structure consistent with some embodiments of the present disclosure.

Referring to FIG. 6, a first isolation layer 203 may be formed on the substrate 200. The first isolation layer 203 may expose the top surfaces of the plurality of initial fin structures 210.

In one embodiment, the first isolation layer 203 may be formed by a process including the following exemplary steps. A first isolation film may be formed on the substrate 200. The first isolation film may cover the sidewall and the top surfaces of the plurality of initial fin structures 210. A planarization process may then be performed on the first isolation film until the top surfaces of the initial fin structures 210 are exposed. As such, the first isolation layer 203 may be formed.

The first isolation layer 203 may be made of a material including $SiO_x$ or SiON. In one embodiment, the first isolation layer 203 is made of $SiO_x$.

In one embodiment, the first isolation film may be formed by a flowable chemical vapor deposition (FCVD) process. In some other embodiments, the first isolation film may be formed by other chemical vapor deposition (CVD) process, including plasma-enhanced chemical vapor deposition (PECVD) process, high aspect-ratio process chemical vapor deposition (HARP-CVD) process, etc. Alternatively, the first isolation film may be formed by a physical vapor deposition (PVD) process.

Figure 7:
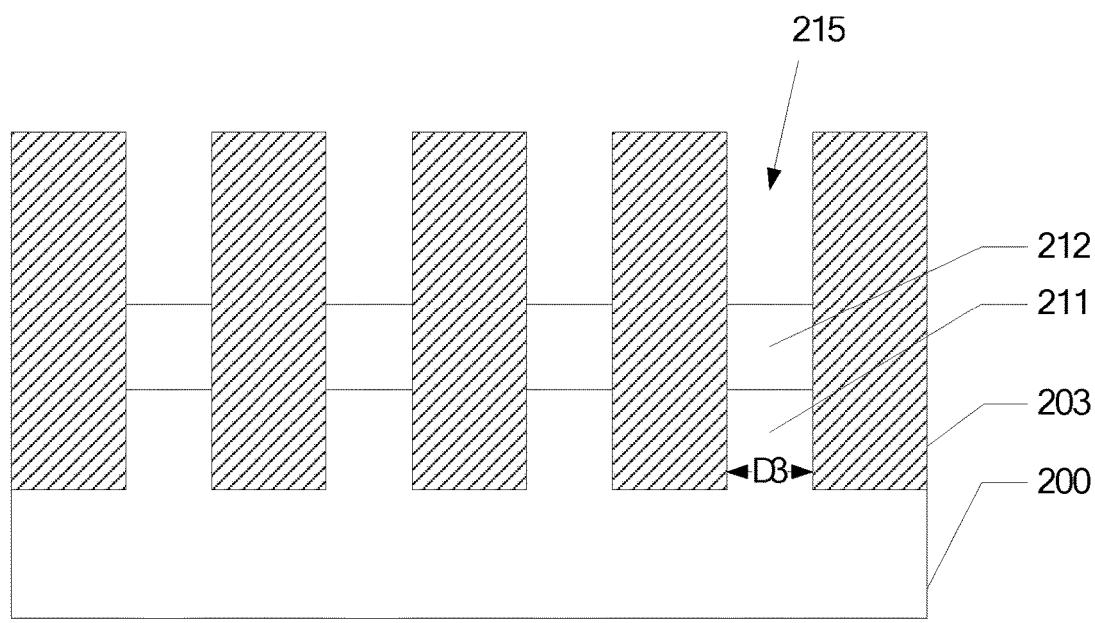

Further, returning to FIG. 13, the third region on each initial fin structure may be removed to form a first opening in the first isolation layer (S403). FIG. 7 illustrates a schematic cross-section view of a semiconductor structure consistent with some embodiments of the present disclosure.

Referring to FIG. 7, the third region 213 (referring to FIG. 6) of each initial fin structure 210 (referring to FIG. 6) may be removed to form a first opening 215 in the first isolation layer 203. In one embodiment, the mask structure 214 (referring to FIG. 6) formed on each initial fin structure 210 may be removed, when removing the third region 213.

The first opening 215 may be formed in the first isolation layer 203 by a first etching process. The sidewall surfaces of the first opening 215 may be used to form a second isolation layer in a subsequent process. That is, in a subsequent process, a second isolation layer may be formed on the sidewall surfaces of each first opening 215.

The first etching process may be a wet etching process, a dry etching process, or a process combining both wet etching process and dry etching process.

In one embodiment, the first etching process is an anisotropic dry etching process. In other embodiments, the first etching process may be a chemical etching process under a fluoride-based (F-based) etching environment. The etching gas may be one or more of $C_4F_8$, $C_4F_6$, $C_5F_8$, and $C_3F_8$; the etching power may be in a range of approximately 300 W to 400 W; and the etching pressure may be in a range of approximately 10 mTorr to 30 mTorr.

Figure 8:
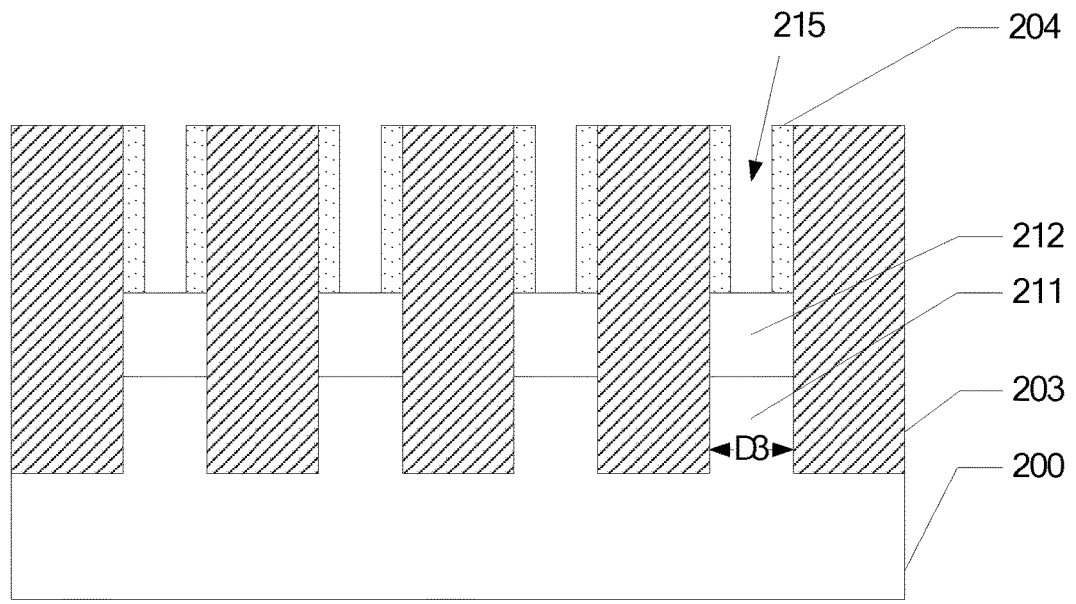

Returning to FIG. 13, a second isolation layer may be formed on the sidewall surfaces of each first opening (S404). FIG. 8 illustrates a schematic cross-section view of a semiconductor structure consistent with some embodiments of the present disclosure.

Referring to FIG. 8, a second isolation layer 204 may be formed on the sidewall surfaces of the plurality of first openings 215.

Changing the thickness of the second isolation layer 204 may be able to control a third width of a subsequently-formed fifth region, and thus may be conducive to improving the integration level of the device.

The second isolation layer 204 may be formed on the sidewall surfaces of the first openings 215 by a process including the following exemplary steps. A second isolation film may be formed on the first isolation layer 203. The second isolation film may also cover the sidewall and the bottom surfaces of the plurality of first openings 215. The portion of the second isolation film formed on the bottom surfaces of the first openings 215 and the top of the first isolation layer 203 may be removed. As such, the second isolation layer 204 may be formed on the sidewall surfaces of the first openings 215.

The second isolation film may be formed by a CVD process, an atomic layer deposition (ALD) process, or a process combining the CVD and the ALD.

In one embodiment, the second isolation film is formed by an ALD process, and the portion of the second isolation film formed on the bottom surfaces of the first openings 215 and on the top surface of the first isolation layer is removed by an anisotropic dry etching process.

The second isolation layer 204 may be made of a same material as the first isolation layer 203, or may be made of a material different from the material of the first isolation layer 203. The second isolation layer 204 may be made of a material including $SiN_x$, $SiO_x$, or SiON. In one embodiment, the second isolation layer 204 is made of $SiN_x$.

In one embodiment, the thickness of the second isolation layer 204 may be in a range of approximately 20 Å to 50 Å. When the thickness of the second isolation layer 204 is too small, the plasma during the dry etching process may easily cause damage to the second isolation layer such that the second isolation layer 204 may not be able to provide sufficient protection for the sidewall surfaces of the plurality of first openings 215 during a subsequently-performed third etching process. Therefore, the portion of the first isolation layer 203 on the sidewalls of the first openings 215 may be etched, which may further affect the profile of the sidewalls of subsequently-formed fifth regions and cause undesired effects to the electrical properties of the semiconductor device during operation. However, when the thickness of the second isolation layer 204 is too large, during a subsequently-performed process to remove the second region 212, the overly large thickness of the second isolation layer 204 may cause the second region 212 not fully removed. Moreover, the residue of the second isolation layer 204 may further make the formation of an initial second opening difficult.

Figure 9:
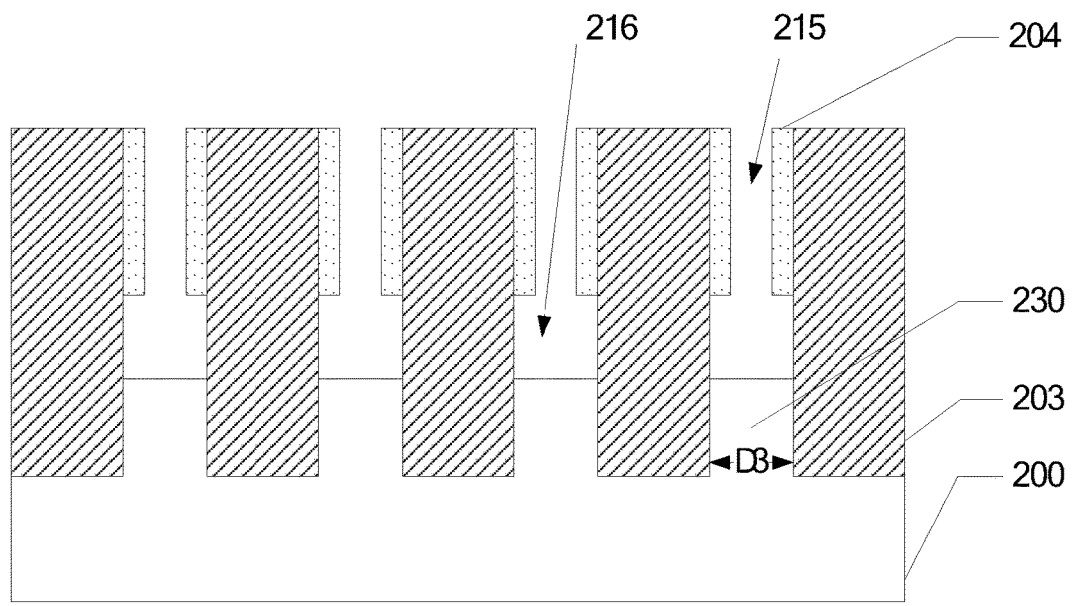

Returning to FIG. 13, after forming the second isolation layer, the second region under each first opening may be removed to form an initial second opening in connection with the bottom of the first opening and also form a first fin structure under the initial second opening (S405). FIG. 9 illustrates a schematic cross-section view of a semiconductor structure consistent with some embodiments of the present disclosure.

Referring to FIG. 9, after forming the second isolation layer 204, the second region 212 (referring to FIG. 8) under the bottom of each first opening 215 may be removed to form an initial second opening 216 and a first fin structure 230. The initial second opening 216 may be connected to the bottom of the first opening 215, and the first fin structure 230 may be under the bottom of the second opening 216.

The first region 211 (referring to FIG. 8) of each initial fin structure 210 (referring to FIG. 6) may become the first fin structure 230 after removing the second region 212. Therefore, the width of the first fin structure 230 along the direction perpendicular to the length direction of the first fin structure 230 may be equal to the first width D3.

The initial second opening 216 may expose the top surface of the corresponding first fin structure 230 and a portion of the sidewall surfaces of the first isolation layer 203. In a subsequent process, by etching a portion of the sidewall surfaces of the first isolation layer 203 exposed in each initial second opening 216, a second opening may be formed.

The process to remove the second region 212 on the bottom of each first opening 215 may be a wet etching process, a dry etching process, or a process combining both wet etching process and dry etching process.

In one embodiment, a second etching process may be performed to remove the second region 212 at the bottom of each first opening 215. Moreover, the second etching process may be an anisotropic dry etching process.

In other embodiments, a chemical etching process under a fluorine-based etching environment may be adopted. The etching gas may be one or more of $C_4F_8$, $C_4F_6$, $C_5F_8$, and $C_3F_8$; the etching power may be in a range of approximately 300 W to 400 W; and the etching pressure may be in a range of approximately 10 mTorr to 30 mTorr.

Figure 10:
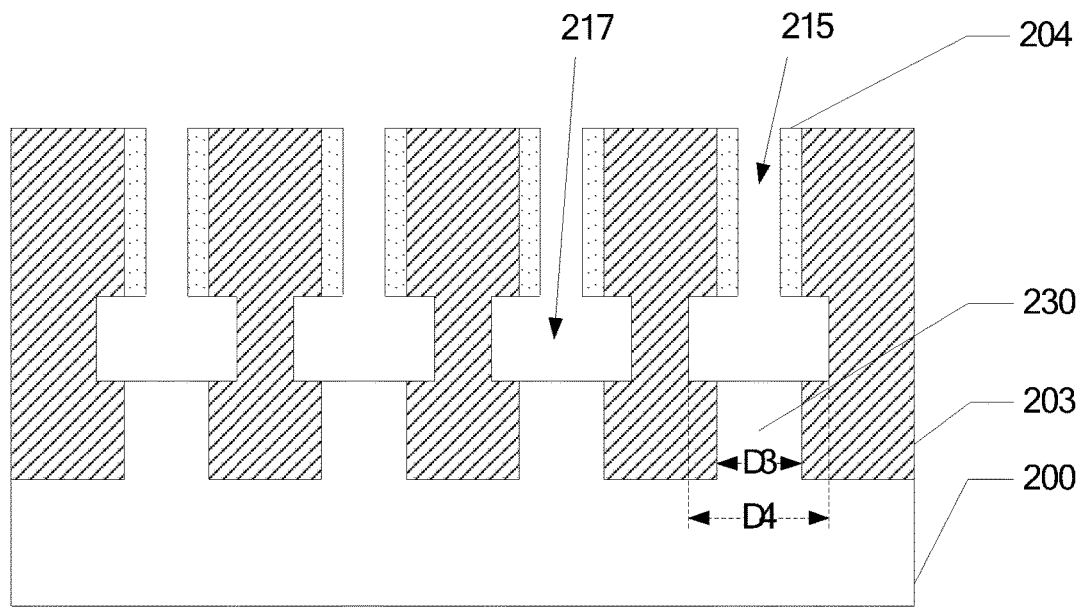

Further, returning to FIG. 13, a portion of the sidewall surfaces of the first isolation layer exposed in each initial second opening may be removed to form a second opening (S406). FIG. 10 illustrates a schematic cross-section view of a semiconductor structure consistent with some embodiments of the present disclosure.

Referring to FIG. 10, the portion of the sidewall surfaces of the first isolation layer 203 exposed in each initial second opening 216 (referring to FIG. 9) may be removed to form a second opening 217. Therefore, the formed second opening 217 may expose a portion of the sidewall surfaces of the first isolation layer 203.

Each second opening 217 may be used to form a fourth region in a subsequent process. The second opening 217 may have a second width D4 along a direction perpendicular to the length direction of the first fin structure 230. Because the fourth region is formed after performing an etching process on the sidewall surfaces of the corresponding initial second opening 216, the second width D4 of the fourth region may be larger than the first width D3 of the first fin structure 230. In a subsequent process, a second fin structure may be formed to fill up the first opening 215 and the second opening 217. Therefore, the contact area between the second fin structure and the first isolation layer 203 may be increased so that the heat generated during the operation of the semiconductor structure may be more easily dispersed through the substrate. As such, problems caused by the self-heating effect may be avoided, and the electrical stability and reliability of the semiconductor structure may also be improved.

The sidewall surfaces of the plurality of initial second openings 216 may be etched through a third etching process. Changing the etch time of the third etching process may be able to control the second width D4 of the subsequently-formed fourth region, and thus may improve the process flexibility and also provide a process window for improving the electrical stability and reliability of the semiconductor structure.

The third etching process may be a wet etching process, a dry etching process, or a process combining both wet etching process and dry etching process.

In one embodiment, the third etching process is a process combining wet etching process and dry etching process. For example, the plurality of initial second openings 216 may be cleaned by a wet etching to ensure that the cleanliness in the subsequently-formed second openings 217, and then a dry etching process may be performed on the portion of the first isolation layer 203 exposed by the sidewall surfaces of the plurality of initial second openings 216 to form the plurality of second openings 217.

Further, returning to FIG. 13, a second fin structure may be formed in each first opening and the second opening that is connected to the first opening, the second fin structure including a fourth portion formed in the second opening and a fifth region formed in the first opening (S407). FIG. 11 illustrates a schematic cross-section view of a semiconductor structure consistent with some embodiments of the present disclosure.

Referring to FIG. 11, a second fin structure 220 may be formed in each first opening 215 (referring to FIG. 10) and also in the second opening 217 (referring to FIG. 10) that is connected to the bottom or the first opening 215.

Each second fin structure 220 may include a fourth region 222 formed in the second opening 217 and a fifth region 221 formed in the first opening 215. The fourth region 222 may be located on the top of a corresponding first fin structure 230, and the fifth region 221 may be located on the top of the fourth region 222.

In one embodiment, the first fin structure 230 may have a first width D3 along the direction perpendicular to the length direction of the first fin structure 230; the fourth region 222 may have a second width D4 along the direction perpendicular to the length direction of the first fin structure 230; and the fifth region 221 may have a third width D5 along the direction perpendicular to the length direction of the first fin structure 230. Moreover, the second width D4 may be larger than the first width D3, and the first width D3 may be larger than the third width D5.

The plurality of second fin structures 220 may be formed by filling a semiconductor film into the plurality of first openings 215 and the plurality of second openings 217.

The semiconductor film may be made of a material including one or more of SiB, SiGe, SiC, SiP, SiAs, SiGeB, SiCB, GaN, InAs, and InP.

In some other embodiments, the semiconductor film may be made of Ge, GeSn, a Group III-V semiconductor compound, a Group II-VI semiconductor compound, or any other appropriate semiconductor material. In other embodiments, the semiconductor film may be made of SiC with an atomic concentration of carbon dopants in a range of approximately 0.2% to 4.0%.

The semiconductor film may be formed by an epitaxial growth process. The epitaxial growth process may be one or more of decompression epitaxy, low temperature epitaxy, selective epitaxy, liquid-phase epitaxy, heteroepitaxy, and molecular epitaxy.

In one embodiment, the semiconductor film is made of SiGe. The process parameters adopted to form the semiconductor film may include a process gas including $H_2$, HCl, $SiH_2Cl_2$ (dichlorosilane, i.e., DCS), and $GeH_4$, a gas flow rate of $H_2$ is a range of approximately 1000 sccm to 30000 sccm, a gas flow rate of HCl in a range of approximately 10 sccm to 200 sccm, a gas flow rate of $SiH_2Cl_2$ in a range of approximately 20 sccm to 2000 sccm, a gas flow rate of $GeH_4$ in a range of approximately 10 sccm to 500 sccm, a process pressure in a range of approximately 8 Torr to 300 Torr, and a process temperature in a range of approximately 600° C. to 850° C.

In some other embodiments, dopants may be introduced at the same time as the epitaxial growth process is performed. For example, B, P, or As ions may be doped into a SiGe semiconductor film. During the epitaxial growth of the SiGe film, $GeH_4$ may be introduced, $H_2$ may be selected as the carrier gas, and $SiH_2Cl_2$ may be selected as reactive gas. The concentration ratio of Si to Ge in the epitaxially formed SiGe semiconductor film may be in a range of approximately 10:1 to 6:4. During the epitaxial growth process of the SiGe semiconductor film, $AsH_3$, $PH_3$, or $BH_3$ may be introduced to dope the SiGe semiconductor film.

In other embodiments, forming the plurality of second fin structures in the first openings and the second openings may also include performing a chemical mechanical polishing process on the semiconductor film to expose the top surface of the first isolation layer.

Returning to FIG. 13, after forming the plurality of second fin structures, a top portion of the first isolation layer and the second isolation layer may be removed to expose a top portion of the sidewall surfaces of each fifth region (S408). FIG. 12 illustrates a schematic cross-section view of a semiconductor structure consistent with some embodiments of the present disclosure.

Referring to FIG. 12, after forming the plurality of second fin structures 220, a top portion of the first isolation layer 203 and the second isolation layer 204 may be removed through an etching process to expose a top portion of the sidewall surfaces of each fifth region 221.

The portion of the first isolation layer 203 and the second isolation layer 204 may be removed by a wet etching process, a dry etching process, or a process combining both wet etching process and dry etching process.

In one embodiment, a dry etching process may be adopted to etch the first isolation layer 203 and the second isolation layer 204. The process parameters used in the dry etching process may include a process gas including He, $NH_3$, and $NF_3$, a gas flow rate of He in a range of approximately 600 sccm to 2000 sccm, a gas flow rate of $NH_3$ in a range of approximately 200 sccm to 500 sccm, a gas flow rate of $NF_3$ in a range of approximately 20 sccm to 200 sccm, a process pressure in a range of approximately 2 Torr to 10 Torr, and a process time in a range of approximately 35 s to 500 s.

In some other embodiments, the portion of the first isolation layer and the second isolation layer may be removed by a wet etching process using diluted hydrofluoric acid (DHF) as an etch solution, depending on the materials used for the first and second isolation layers.

In other embodiments, the first isolation layer and the second isolation layer may be etched using a Siconi etching process. The process gas used in the Siconi etching process may include $NF_3$ and $NH_3$. The Siconi etching process may include a remote plasma etching step and an in-situ annealing step. For example, the process gas including $NF_3$ and $NH_3$ may first be converted into $NH_4F$ and $NH_4F_2$ plasma, and then the plasma may react with the first isolation layer and the second isolation layer to form $(NH_4)SiF_6$; further, by performing an in-situ annealing process, $(NH_4)SiF_6$ may be decomposed into gaseous $SiF_4$, $NH_3$, and HF, and thus be pumped out.

Accordingly, the present disclosure provides a semiconductor structure. FIG. 12 illustrates a schematic cross-section view of an exemplary semiconductor structure consistent with various embodiments of the present disclosure.

Referring to FIG. 12, the semiconductor structure may include a substrate 200 and a plurality of first fin structures 230 formed on the substrate 200. Each first fin structure 230 may have a first width D3 along a direction perpendicular to the length direction of the first fin structure 230. The semiconductor structure may also include a second fin structure 220 on each first fin structure 230. The second fin structure 220 may include a fourth region 222 formed on the first fin structure 230 and a fifth region 221 formed on the fourth region 222. The fourth region 222 may have a second width D4 along the direction perpendicular to the length direction of the first fin structure 230, and the fifth region 221 may have a third width D5 along the direction perpendicular to the length direction of the first fin structure 230. The second width D4 may be larger than the first width D3, and the first width D3 may be larger than the third width D5. The semiconductor structure may further include a second isolation layer 204 covering a bottom portion of the sidewall surfaces of each fifth region 221, and a first isolation layer 203 covering the sidewall surfaces of each first fin structure 230, the sidewall surfaces of each fourth region 222, and the sidewall surfaces of the second isolation layer 204.

The material, the dimension, and the structure of the second fin structure 220 may be referred to the corresponding descriptions provided in the above embodiments.

The first isolation layer 203 may be made of a material including $SiO_x$ or SiON. The second isolation layer 204 may be made of a same material as the first isolation layer 203, or may be made of a material different from the material of the first isolation layer 203. The materials, the dimensions, and the structures of the first isolation layer 203 and the second isolation layer 204 may referred to the corresponding descriptions provided in the above embodiments.

Compared to conventional semiconductor structures and fabrication methods, the disclosed semiconductor structures and fabrication methods may demonstrate advantages.

According to the disclosed semiconductor structures and fabrication methods, a first isolation layer is formed on the substrate. Further, by etching the sidewall surfaces of the first isolation layer, a second width of a fourth region formed in a subsequent process is larger than a first width of the first fin structure such that the contact area between a subsequently-formed second fin structure and the first isolation layer is increased. Therefore, heat generated during the operation of the semiconductor structure may be more easily dispersed through the substrate. As such, problems caused by the self-heating effect may be avoided, and the electrical stability and reliability of the semiconductor structure may also be improved.

Further, a second isolation layer is formed on the sidewall surfaces of each first opening during the fabrication process.

Changing the thickness of the second isolation layer may be able to control a third width of a subsequently-formed fifth region, and thus may be conducive to improving the integration level of the device.

Further, the sidewall surfaces of each initial second opening are etched by a third etching process during the fabrication of the semiconductor device. Changing the etch time of the third etching process may be able to control the second width of the subsequently-formed fourth region, and thus may improve the process flexibility and also provide a process window for improving the electrical stability and reliability of the semiconductor structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
    forming a plurality of initial fin structures on a substrate, each initial fin structure including a first region, a second region on the first region, and a third region on the second region;
    forming a first isolation layer on the substrate, the first isolation layer exposing top surfaces of the plurality of initial fin structures;
    removing each third region to form a first opening in the first isolation layer;
    forming a second isolation layer on sidewall surfaces of each first opening;
    removing the second region under each first opening to form an initial second opening connecting the first opening, wherein the first region under the initial second opening is used as a first fin structure;
    performing an etching process on the first isolation layer on sidewall surfaces of each initial second opening to form a second opening exposing the first isolation layer;
    forming a second fin structure in each first opening and the second opening under the first opening; and
    removing a top portion of each of the first isolation layer and the second isolation layer to expose a portion of sidewall surfaces of each second fin structure.

2. The method according to claim 1, wherein:
    each second fin structure includes a fourth region formed in the second opening and a fifth region formed in the first opening; and
    the fourth region is located on top of the first fin structure, and the fifth region is located on top of the fourth region.

3. The method according to claim 2, wherein:
    the first fin structure has a first width along a direction perpendicular to a length direction of the first fin structure;
    the fourth region has a second width along the direction perpendicular to the length direction of the first fin structure; and
    the fifth region has a third width along the direction perpendicular to the length direction of the first fin structure, wherein
    the second width is larger than the first width; and
    the first width is larger than the third width.

4. The method according to claim 1, wherein forming the second isolation layer on the sidewall surfaces of each first opening includes:
    forming a second isolation film on a top surface of the first isolation layer, the second isolation film also covering sidewall and bottom surfaces of each first opening; and
    removing a portion of the second isolation film formed on the top surface of the first isolation layer and the bottom surface of each first opening to form the second isolation layer covering the sidewall surfaces of each first opening.

5. The method according to claim 4, wherein:
    the portion of the second isolation film is removed through an anisotropic dry etching process.

6. The method according to claim 1, wherein forming the second fin structure in each first opening and the second opening under the first opening includes:
    forming a semiconductor film to fill the first opening and the second opening.

7. The method according to claim 6, wherein:
    the semiconductor film is formed by an epitaxial growth process.

8. The method according to claim 6, wherein:
    the semiconductor film is made of a material including one or more of SiB, SiGe, SiC, SiP, SiAs, SiGeB, SiCB, GaN, InAs, and InP.

9. The method according to claim 6, wherein:
    the semiconductor film is made of SiC with an atomic concentration of carbon dopants in a range of approximately 0.2% to 4.0%.

10. The method according to claim 1, further including:
    forming a mask structure formed on the third region of each initial fin structure, and removing the mask structure, when removing the third region.

11. The method according to claim 1, wherein forming the first isolation layer on the substrate includes:
    forming a first isolation film on the substrate to cover sidewall and top surfaces of the plurality of initial fin structures;
    performing a planarization process on the first isolation film until the top surfaces of the plurality of initial fin structures are exposed.

12. The method according to claim 11, wherein:
    the first isolation layer is made of a material including $SiO_x$ or SiON.

13. The method according to claim 1, wherein:
    the second isolation layer is made of a material including $SiN_x$, $SiO_x$ or SiON.

14. The method according to claim 1, wherein:
    a thickness of the second isolation layer is in a range of approximately 20 Å to 50 Å.

* * * * *